(12) United States Patent
Park et al.

(10) Patent No.: US 9,869,911 B2
(45) Date of Patent: Jan. 16, 2018

(54) DISPLAY APPARATUS HAVING A DRIVER DISPOSED ON A FLEXIBLE SUBSTRATE AND METHOD OF MANUFACTURING THE SAME

(71) Applicant: SAMSUNG DISPLAY CO., LTD., Yongin-si, Gyeonggi-do (KR)

(72) Inventors: Jeongjin Park, Hwaseong-si (KR); Seongsik Choi, Asan-si (KR); Inae Park, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/156,749

(22) Filed: May 17, 2016

(65) Prior Publication Data
US 2017/0146848 A1    May 25, 2017

(30) Foreign Application Priority Data
Nov. 19, 2015   (KR) ........................ 10-2015-0162708

(51) Int. Cl.
| | |
|---|---|
| H01L 21/00 | (2006.01) |
| G02F 1/1345 | (2006.01) |
| G02F 1/133 | (2006.01) |
| G02F 1/1333 | (2006.01) |
| G02F 1/1368 | (2006.01) |
| H01L 27/12 | (2006.01) |
| H01L 27/32 | (2006.01) |

(52) U.S. Cl.
CPC ........ *G02F 1/13452* (2013.01); *G02F 1/1368* (2013.01); *G02F 1/13306* (2013.01); *G02F 1/13458* (2013.01); *G02F 1/133305* (2013.01); *H01L 27/124* (2013.01); *H01L 27/1222* (2013.01); *H01L 27/1262* (2013.01); *H01L 27/3262* (2013.01); *H01L 2227/323* (2013.01); *H01L 2251/533* (2013.01); *H01L 2251/5338* (2013.01)

(58) Field of Classification Search
CPC ............... H01L 27/124; H01L 27/1262; H01L 27/1222; H01L 27/3262; H01L 2251/533; H01L 2251/5338; H01L 2227/323
See application file for complete search history.

(56) References Cited

U.S. PATENT DOCUMENTS

| | | |
|---|---|---|
| 7,459,779 B2 | 12/2008 | Chung et al. |
| 2006/0232738 A1 | 10/2006 | Lin et al. |
| 2014/0085281 A1 | 3/2014 | Lim |

(Continued)

*Primary Examiner* — Thanh Y Tran
(74) *Attorney, Agent, or Firm* — F. Chau & Associates, LLC

(57) ABSTRACT

A display apparatus includes a display panel and a display panel driver. The display panel includes a first substrate and a second substrate facing the first substrate, the first substrate including a switching element and a pixel electrode disposed thereon, the pixel electrode being electrically connected to the switching element. The display panel driver is configured to apply a driving signal to the display panel. The display panel driver includes a first flexible substrate on which a driving chip is mounted, wherein the first flexible substrate is electrically connected to the display panel, and a second flexible substrate electrically connected to the first flexible substrate, wherein the second flexible substrate is disposed on a surface of the first flexible substrate.

17 Claims, 11 Drawing Sheets

(56) References Cited

U.S. PATENT DOCUMENTS

| | | | |
|---|---|---|---|
| 2015/0179670 A1* | 6/2015 | Kang | H01L 27/124 257/773 |
| 2016/0266426 A1* | 9/2016 | Song | G02F 1/13306 |
| 2017/0069253 A1* | 3/2017 | Jang | G09G 3/2092 |

\* cited by examiner

DISPLAY APPARATUS HAVING A DRIVER DISPOSED ON A FLEXIBLE SUBSTRATE AND METHOD OF MANUFACTURING THE SAME

CROSS-REFERENCE TO RELATED APPLICATION

This application claims priority under 35 U.S.C. §119 to Korean Patent Application No. 10-2015-0162708, filed on Nov. 19, 2015, in the Korean Intellectual Property Office (KIPO), the contents of which are incorporated by reference herein in their entirety.

TECHNICAL FIELD

Exemplary embodiments of the present invention relate to a display apparatus. More particularly, exemplary embodiments of the present invention relate to a display apparatus including a driver disposed on a flexible substrate and a method of manufacturing the same.

DISCUSSION OF THE RELATED ART

A display apparatus includes a display panel and a display panel driver applying a driving signal to the display panel. The display panel driver may include a flexible substrate on which a driving chip is mounted.

In a display panel including a bottom emission structure, the display panel is arranged such that a first surface of the array substrate faces a user.

When the flexible substrate is connected to a surface of the array substrate, foreign matter may be trapped between the flexible substrate and the array substrate. Accordingly, a reliability of the electrical connection between the array substrate and the flexible substrate is reduced.

SUMMARY

According to an exemplary embodiment of the present invention, a display apparatus includes a display panel and a display panel driver configured to apply a driving signal to the display panel. The display panel includes a first substrate and a second substrate facing the first substrate, the first substrate including a switching element and a pixel electrode disposed thereon, the pixel electrode being electrically connected to the switching element. The display panel driver includes a first flexible substrate on which a driving chip is mounted, wherein the first flexible substrate is electrically connected to the display panel, and a second flexible substrate electrically connected to the first flexible substrate, wherein the second flexible substrate is disposed on a surface of the first flexible substrate.

In an exemplary embodiment of the present invention, the first flexible substrate includes a first substrate body on which the driving chip is mounted, the first substrate body extending in a first direction, and a first substrate connection portion extending from the first substrate body in a second direction crossing the first direction, wherein the first substrate connection portion is connected to the display panel. The second flexible substrate includes a second substrate body contacting the first flexible substrate, the second substrate body extending in the first direction, and a second substrate connection portion extending from the second substrate body in a direction opposite to the second direction, wherein the second substrate connection portion is connected to the display panel.

In an exemplary embodiment of the present invention, the driving chip is mounted on a first surface of the first substrate body, and the second substrate body contacts the first surface of the first substrate body.

In an exemplary embodiment of the present invention, the display panel further includes a controller configured to generate a control signal, wherein the controller is connected to the first flexible substrate. An input terminal of the driving chip receives the control signal, and the driving chip generates the driving signal based on the control signal, wherein the driving signal is output through a first and a second output terminal of the driving chip. The first flexible substrate electrically connects the controller with the display panel.

In an exemplary embodiment of the present invention, the first flexible substrate further includes an input wire disposed on the first substrate body, the input wire electrically connecting the controller with the input terminal of the driving chip, a first output wire disposed on the first surface of the first substrate body and a surface of the first substrate connection portion, the first output wire electrically connecting the first output terminal with the display panel, and a second output wire disposed on the surface of the first substrate body, the second output wire electrically connecting the second flexible substrate with the second output terminal.

In an exemplary embodiment of the present invention, the input wire electrically connects the controller with the input terminal of the driving chip through an input pad. The input pad is disposed on the first surface of the first substrate body, and the input pad contacts the controller.

In an exemplary embodiment of the present invention, the first output wire electrically connects the first output terminal of the driving chip with the display panel through a first output pad. The first output pad contacts the display panel, and the first output pad is disposed on the surface of the first substrate connection portion.

In an exemplary embodiment of the present invention, the second flexible substrate further includes a third output wire disposed on a surface of the second substrate body and a surface of the second substrate connection portion, the third output wire electrically connecting the second output wire with the display panel.

In an exemplary embodiment of the present invention, the third output wire electrically connects the second output wire with the display panel though a middle pad. The middle pad is interposed between the first substrate body and the second substrate body, and the middle pad contacts the second output wire.

In an exemplary embodiment of the present invention, the third output wire electrically connects the second output wire with the display panel though a second output pad. The second output pad is disposed on the surface of the second substrate connection portion, and the second output pad contacts the display panel.

In an exemplary embodiment of the present invention, the first output wire electrically connects the first output terminal of the driving chip with the display panel through a first output pad. The first output pad contacts the display panel, and the first output pad is disposed on the surface of the first substrate connection portion. When a plurality of first output pads are disposed on the first surface of the first substrate connection portion and a plurality of second output pads are disposed on the surface of the second substrate connection portion, the plurality of first output pads and the plurality of plurality of second output pads are arranged to alternate in a zigzag shape along a third direction crossing the first and second directions.

In an exemplary embodiment of the present invention, the second substrate body further includes at least two protrusion portions protruding in the first direction, wherein the at least two protrusion portions are spaced apart from each other and contact the first substrate body of the first flexible substrate.

In an exemplary embodiment of the present invention, the driving chip is disposed between the at least two protrusion portions.

In an exemplary embodiment of the present invention, the driving signal includes a data voltage, and the driving chip is a data driving chip configured to generate the data voltage.

In an exemplary embodiment of the present invention, the driving signal includes a gate signal, and the driving chip is a gate driving chip configured to generate the gate signal.

In an exemplary embodiment of the present invention, the display panel has a bottom emission structure.

In an exemplary embodiment of the present invention, the display panel further includes a liquid crystal layer or an organic light emitting layer, interposed between the first and second substrates.

According to an exemplary embodiment of the present invention, a method of manufacturing a display apparatus includes providing a display panel including a first substrate and a second substrate facing the first substrate, the first substrate including a switching element and a pixel electrode electrically connected to the switching element, and connecting a first flexible substrate, on which a driving chip is mounted, and a second flexible substrate with the display panel, wherein the second flexible substrate is disposed on a surface of the first flexible substrate.

In an exemplary embodiment of the present invention, the first flexible substrate includes a first substrate body on which the driving chip is mounted, the first substrate body extending in a first direction, and a first substrate connection portion extending from the first substrate body in a second direction crossing the first direction, wherein the first substrate connection portion is connected to the display panel. The second flexible substrate includes a second substrate body contacting the first flexible substrate, the second substrate body extending in the first direction, and a second substrate connection portion extending from the second substrate body in a direction opposite to the second direction, wherein the second substrate connection portion is connected to the display panel. Connecting the first and second flexible substrates with the display panel includes disposing the first and second substrate connection portions on the display panel.

In an exemplary embodiment of the present invention, each of the first and second flexible substrates includes a shape memory material. Connecting the first and second flexible substrates with the display panel further includes applying heat to the first and second flexible substrates such that the first substrate connection portion extends in the second direction and the second substrate connection portion extends in the direction opposite to the second direction.

BRIEF DESCRIPTION OF THE DRAWINGS

The present invention will become more clearly understood by describing in detail exemplary embodiments thereof in conjunction with the accompanying drawings, in which.

DETAILED DESCRIPTION OF THE EMBODIMENTS

Figure 1:
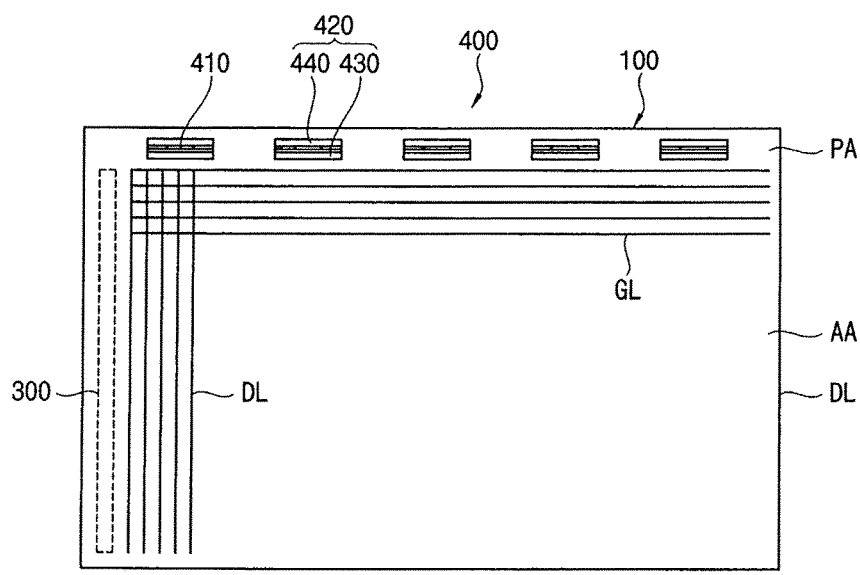
FIG. 1 is a plan view illustrating a display apparatus according to an exemplary embodiment of the present invention.
Figure 1:
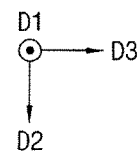

Exemplary embodiments of the present invention will be described more fully hereinafter with reference to the accompanying drawings. The present invention may, however, be embodied in many different forms and should not be construed as limited to the exemplary embodiments set forth herein. The disclosed exemplary embodiments of the present invention are provided to convey the scope of the present invention to those skilled in the art. Like reference numerals may refer to like elements throughout this application.

Figure 2:
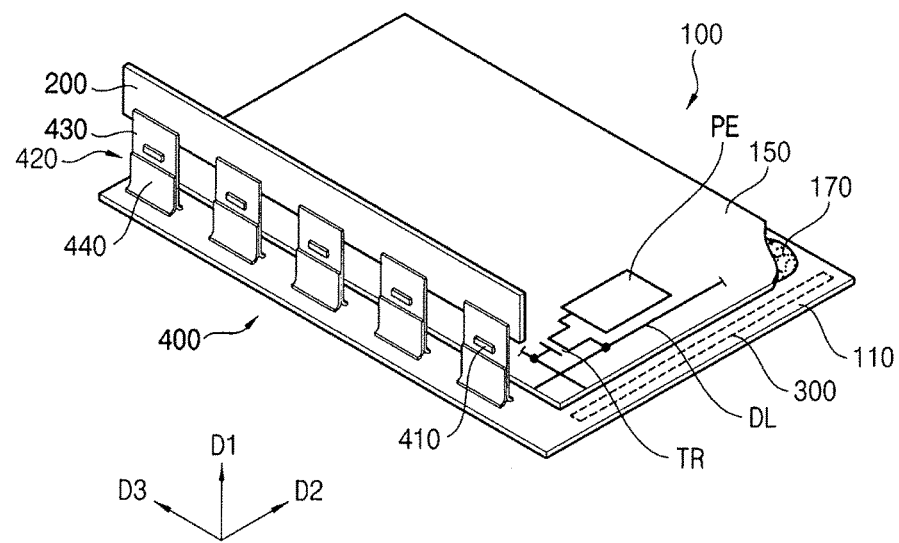
FIG. 2 is a perspective view illustrating the display apparatus of FIG. 1 according to an exemplary embodiment of the present invention.
Figure 3:
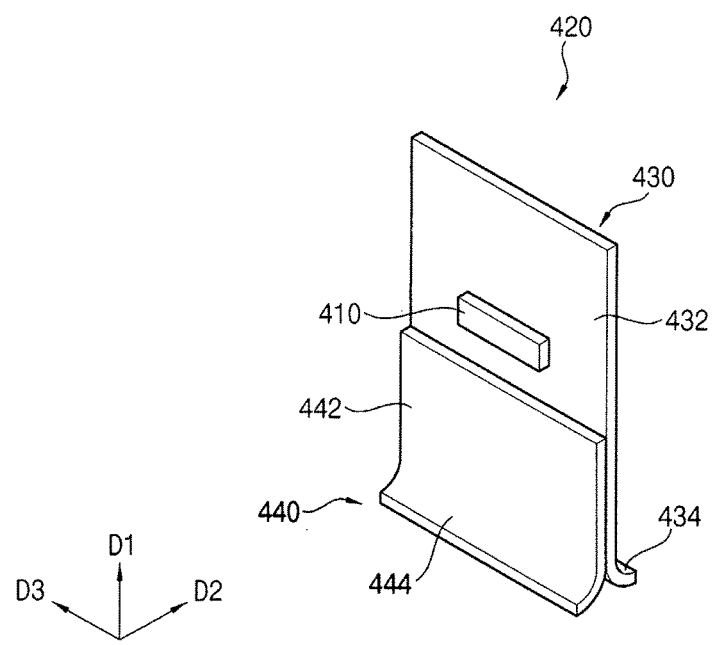
FIG. 3 is a perspective view illustrating a data flexible substrate of FIG. 1 according to an exemplary embodiment of the present invention.
Figure 4:
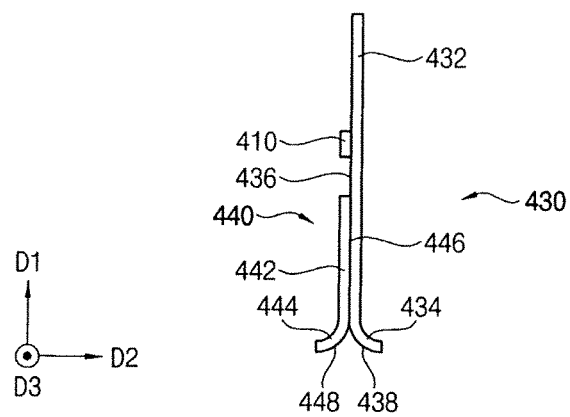
FIGS. 4 and 5 are side views illustrating the data flexible substrate of FIG. 3 according to an exemplary embodiment of the present invention.
Figure 5:
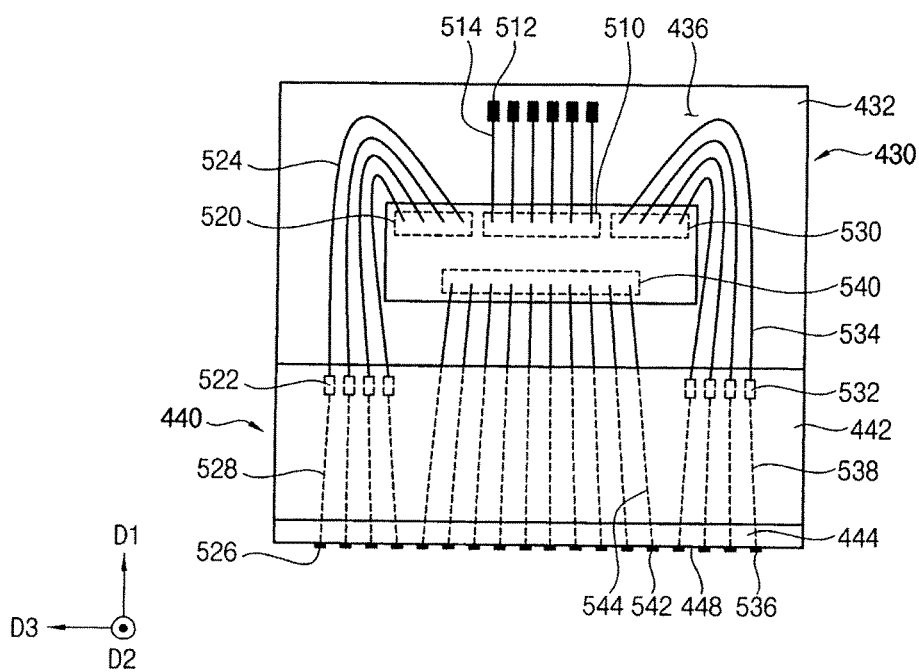
Figure 6:
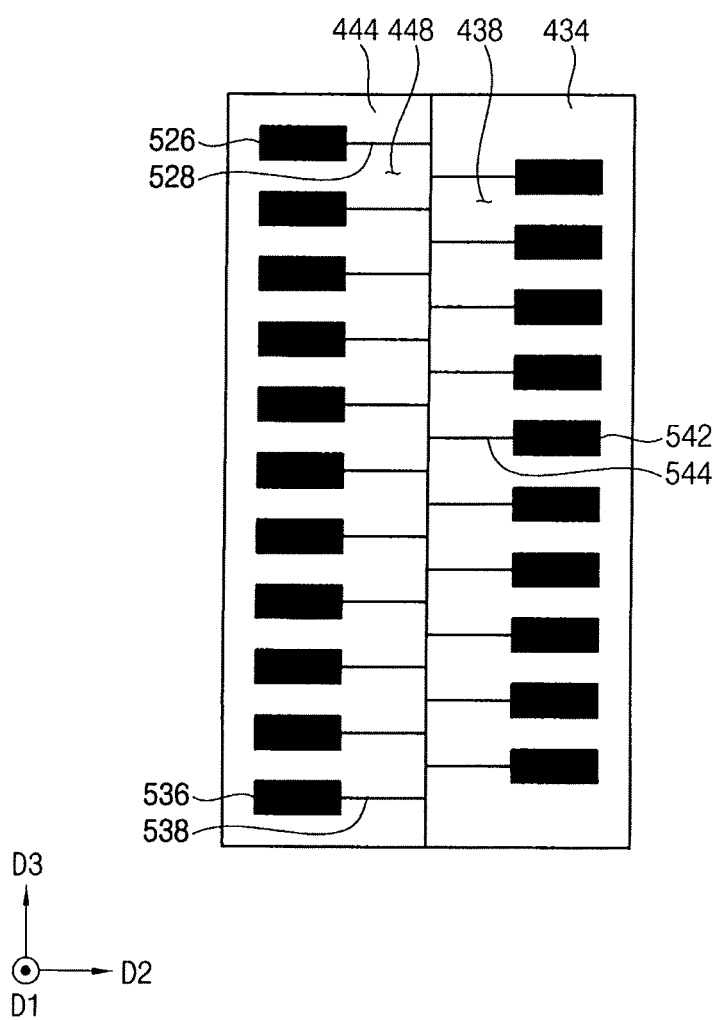
FIG. 6 is a bottom view illustrating the data flexible substrate of FIG. 3 according to an exemplary embodiment of the present invention.

FIG. 1 is a plan view illustrating a display apparatus according to an exemplary embodiment of the present invention. FIG. 2 is a perspective view illustrating the display apparatus of FIG. 1 according to an exemplary embodiment of the present invention. FIG. 3 is a perspective view illustrating a data flexible substrate of FIG. 1 according to an exemplary embodiment of the present invention. FIGS. 4 and 5 are side views illustrating the data flexible substrate of FIG. 3 according to an exemplary embodiment of the present invention. FIG. 6 is a bottom view illustrating the data flexible substrate of FIG. 3 according to an exemplary embodiment of the present invention.

Referring to FIGS. 1 to 6, a display apparatus includes a display panel 100 and display panel driver.

The display panel 100 includes an active region AA on which an image is displayed and the peripheral region PA adjacent to the active region AA and not displaying the image. The active region AA may be referred to as a display region.

The display panel 100 includes a plurality of gate lines GL, each of which extends in a third direction D3, and a plurality of data lines DL, each of which extends in a second direction D2 crossing the third direction D3. The display panel 100 includes a plurality of pixels. The pixels are electrically connected to the gate lines GL and the data lines DL. The gate lines GL, the data lines DL and the pixels are disposed in the active region AA of the display panel 100.

Each pixel includes a switching element TR which is electrically connected to a respective one of the gate lines GL and a respective one of the data lines DL. The pixels may be disposed in a matrix form.

The display panel 100 may include a first substrate 110 and a second substrate 150 opposite to the first substrate 110.

For example, the first substrate 110 may be an array substrate. The gate lines GL and the data lines DL may be disposed on the first substrate 110. A plurality of switching elements TR connected to the gate lines GL and the data lines DL may be disposed on the first substrate 110. A pixel electrode PE may be disposed on the first substrate 110.

The second substrate 150 may be a corresponding substrate opposite to the first substrate 110. A common electrode facing the pixel electrode PE may be disposed under the second substrate 150. A color filter defining a color of a pixel may be disposed under the second substrate 150. Alternatively, the common electrode and the color filter may be disposed on the first substrate 110.

An overlap area between the first substrate 110 and the second substrate 150 may be substantially the same as the active region AA of the display panel 100. Alternatively, the overlap area between the first substrate 110 and the second substrate 150, except for the area where the sealing member is disposed, may be defined to the active region AA of the display panel 100.

The display apparatus may further include a display unit 170 interposed between the first and second substrates 110 and 150. The display unit 170 may include an organic light emitting layer. Alternatively, the display unit 170 may include a liquid crystal layer.

In an exemplary embodiment of the present invention, the display panel 100 may have a bottom emission structure. In the bottom emission structure, the image may be display through the first substrate 110 facing a user of the display apparatus.

The display panel driver may apply a driving signal to the display panel 100. In addition, the display panel driver may include a gate driver 300 and a data driver 400.

In an exemplary embodiment of the present invention, the display panel driver may further include a controller including a printed circuit board 200. The controller may apply a control signal to the gate driver 300 and the data driver 400.

For example, the printed circuit board 200 may include a driving circuit such as a timing controller, a power voltage generator, etc.

The timing controller receives input image data and an input control signal from an external apparatus. The input image data may include red image data, green image data and blue image data. The input control signal may include a master clock signal and a data enable signal. The input control signal may further include a vertical synchronizing signal and a horizontal synchronizing signal.

The timing controller generates a first control signal, a second control signal and a data signal based on the input image data and the input control signal.

The timing controller generates the first control signal for controlling an operation of the gate driver 300 based on the input control signal, and outputs the first control signal to the gate driver 300.

The timing controller generates the second control signal for controlling an operation of the data driver 400 based on the input control signal, and outputs the second control signal to the data driver 400.

The timing controller generates a data signal based on the input image data. The timing controller outputs the data signal to the data driver 400.

The gate driver 300 generates gate signals driving the gate lines GL in response to the first control signal received from the timing controller. The gate driver 300 sequentially outputs the gate signals to the gate lines GL.

In an exemplary embodiment of the present invention, the gate driver 300 may be directly mounted on the peripheral region PA of the display 100 as an amorphous silicon gate (ASG).

The data driver 400 receives the second control signal and the data signal from the timing controller. The data driver 400 converts the data signal into analog data voltages. The data driver 400 outputs the data voltages to the data lines DL.

For example, the control signal may include the first and second control signals and the data signal. The driving signal may include the gate signal and the data voltage.

The data driver 400 may include a data flexible substrate 420 and a data driving chip 410 mounted on the data flexible substrate 420. The data flexible substrate 420 may electrically connect the printed circuit board 200 with the display panel 100. The data driving chip 410 may generate the driving signal.

In an exemplary embodiment of the present invention, a plurality of data flexible substrates 420 may be provided. In addition, a plurality of data driving chips 410 may be provided, each of which being mounted on a respective one of the data flexible substrates 420 as a chip on film (COF).

The data flexible substrate 420 may include a first data flexible substrate 430 and a second data flexible substrate 440. The first data flexible substrate 430, on which the driving chip 410 is mounted, may be electrically connected to the display panel 100. The second data flexible substrate 440 may be disposed on a surface of the first data flexible substrate 430. The second data flexible substrate 440 may be electrically connected to the first data flexible substrate 430.

In an exemplary embodiment of the present invention, the first data flexible substrate 430 may include a first data substrate body 432 and a first data substrate connection portion 434. The first data substrate body 432, on which the data driving chip 410 is mounted, may extend in a first direction D1 crossing the second and third directions D2 and D3. The first data substrate connection portion 434 may extend from the first data substrate body 432 in the second direction D2. The first data substrate connection portion 434 may be connected to the display panel 100.

In addition, the second data flexible substrate 440 may include a second data substrate body 442 and a second data substrate connection portion 444. The second data substrate body 442 may extend in the first direction D1, and the second data substrate body 442 may make contact with the first data substrate body 432. The second data substrate connection portion 444 may extend from the second data substrate body 442 in a direction opposite to the second direction D2. The second data substrate connection portion 444 may be connected to the display panel 100.

The data driving chip 410 may be mounted on a surface 436 of the first data substrate body 432. A surface 446 of the second data substrate body 442 may make contact with the surface 436 of the first data substrate body 432.

An input terminal 510 of the data driving chip 410 may receive the control signal from the printed circuit board 200. The driving chip 410 may generate the driving signal based on the control signal, and the driving chip 410 may output the driving signal to a first output terminal 540 and a plurality of second output terminals 520 and 530.

In an exemplary embodiment of the present invention, the first data flexible substrate 430 may further include an input wire 514 which electrically connect the printed circuit board 200 with the input terminal 510 of the data driving chip 410. The input wire 514 may be disposed on the first data substrate body 432. A plurality of input wires 514 may be provided.

In an exemplary embodiment of the present invention, the first data flexible substrate 430 may further include a first output wire 544 which electrically connects the first output terminal 540 of the data driving chip 410 with the display panel 100. The first output wire 544 may be disposed on the surface 436 of the first data substrate body 432 and a surface 438 of the first data substrate connection portion 434.

In an exemplary embodiment of the present invention, the first data flexible substrate 430 may further include a plurality of second output wires 524 and 534. The second output wires 524 and 534 may electrically connects the second output terminals 520 and 530 spaced apart from the first output terminal 540 of the data driving chip 410 with the second data flexible substrate 440. The second output wires 524 and 534 may be disposed on the surface 436 of the first data substrate body 432.

The input wire 514 may electrically connect the input terminal 510 of the data driving chip 410 with the printed circuit board 200 through an input pad 512 on the surface 436 of the first data substrate body 432. The first data substrate body 432 contacts the printed circuit board 200.

The first output wire 544 may electrically connect the first output terminal 540 with the display panel through a first output pad 542 on the surface 438 of the first data substrate connection portion 434. The first data substrate connection portion 434 contacts the display panel 100.

In an exemplary embodiment of the present invention, the second data flexible substrate 440 may further include a plurality of third output wires 528 and 538. The third output wires 528 and 538 may electrically connect the second output wires 524 and 534 with the display panel 100. The third output wires 528 and 538 may be disposed on the surface 446 of the second data substrate body 442 and a surface 448 of the second data substrate connection portion 444.

The third output wires 528 and 538 may electrically connect the second output wires 524 and 534 with the display panel 100 through a plurality of middle pads 522 and 532. The middle pads 522 and 532 may be interposed between the first data substrate body 432 and the second data substrate body 442. The middle pads 522 and 532 may make contact with the second output wires 524 and 534.

The third output wires 528 and 538 may electrically connect the second output wires 524 and 534 with the display panel 100 through a plurality of second output pads 526 and 536. The second output pads 526 and 536 may be disposed on the surface 448 of the second data substrate connection portion 444. The second output pads 526 and 536 may make contact with the display panel 100.

In an exemplary embodiment of the present invention, a plurality of the first output pads 542, and a plurality of the second output pads 526 and 536 may be provided. The first output pads 542 on the first data substrate connection portion 434 and the second output pads 526 and 536 on the second data substrate connection portion 444 may be arranged in a zigzag shape along the third direction D3. For example, in an exemplary embodiment of the present invention, the plurality of first output pads 542 and the plurality of plurality of second output pads 526 and 536 are arranged to alternate in a zigzag shape along the third direction D3 crossing the first and second directions D1 and D2. For example, the plurality of first output pads 542 and the plurality of plurality of second output pads 526 may be arranged to alternate in a zigzag shape along the third direction D3. In addition, the plurality of first output pads 542 and the plurality of plurality of second output pads 536 may be arranged to alternate in a zigzag shape along the third direction D3.

Accordingly, when the data flexible substrate 420 is connected on the peripheral region PA of the display panel 100, the space for connecting the data flexible substrate 420 with the display panel 100 may be reduced. Accordingly, a fan out margin may be obtained.

In the display apparatus, the first data flexible substrate 430 and the second data flexible substrate 440, disposed on the first data flexible substrate 430, are connected to the peripheral region PA of the display panel 100. Accordingly, insertion of foreign matter between the first data flexible substrate 430 and the display panel 100 and between the second data flexible substrate 440 and the display panel 100 may be reduced.

In addition, the first and second data flexible substrates 430 and 440 may be simultaneously connected to the peripheral region PA of the display panel 100 with a strong adhesion. Accordingly, an electrical connection reliability between the display panel 100 and the first and second data flexible substrates 430 and 440 may be increased.

In the display panel 100 including a bottom emission structure, the first and second data flexible substrates 430 and 440 may be connected to a back surface of the first substrate 110 such that a display apparatus having a bezel-less structure is implemented.

Figure 7:
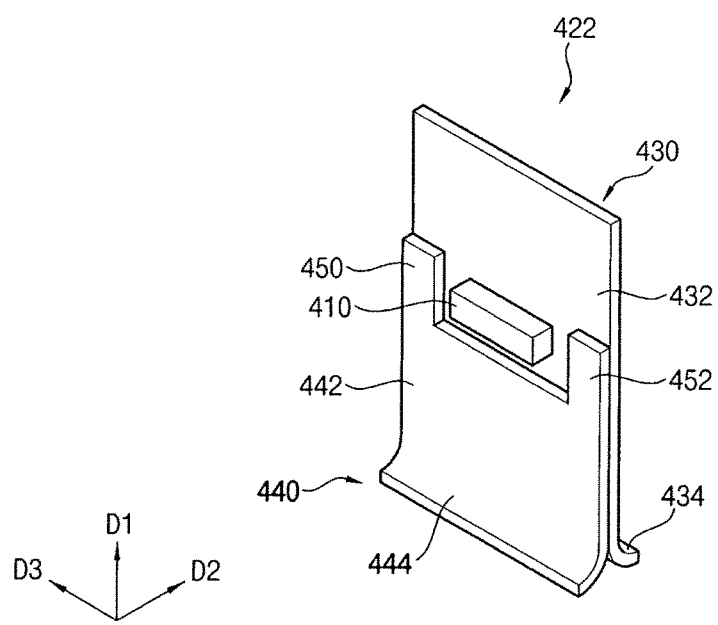
FIG. 7 is a perspective view illustrating a display apparatus according to an exemplary embodiment of the present invention.
Figure 8:
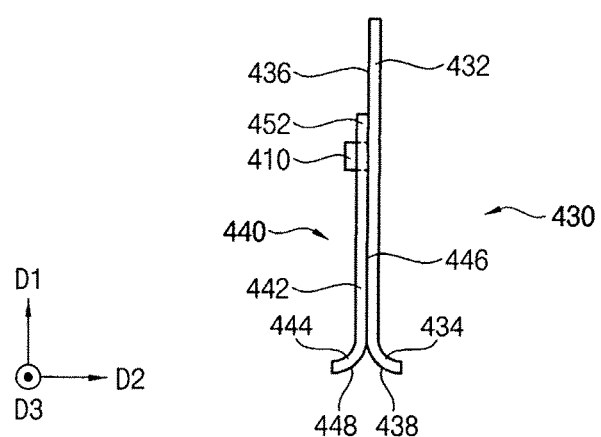
FIGS. 8 and 9 are side views illustrating a data flexible substrate of FIG. 7 according to an exemplary embodiment of the present invention.
Figure 9:
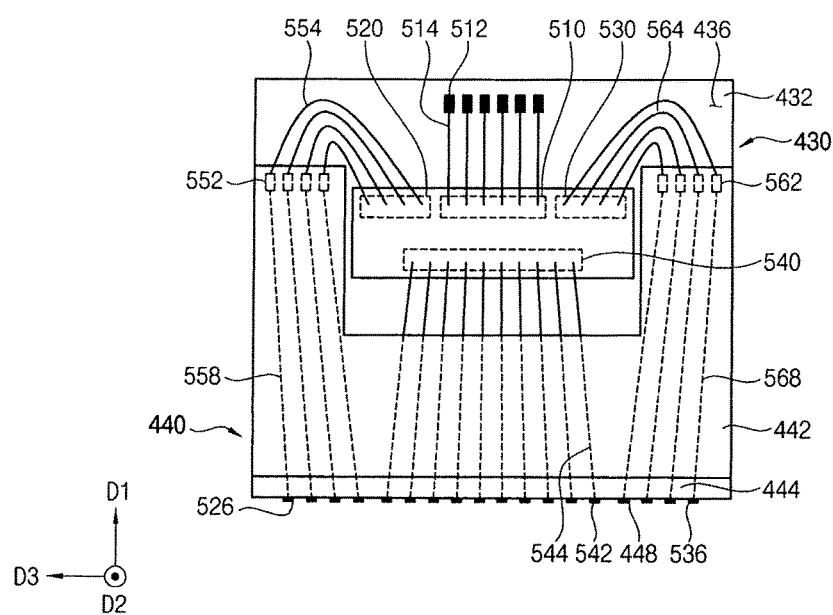

FIG. 7 is a perspective view illustrating a display apparatus according to an exemplary embodiment of the present invention. FIGS. 8 and 9 are side views illustrating a data flexible substrate of FIG. 7 according to an exemplary embodiment of the present invention. A data flexible substrate of FIGS. 7 to 9 may be substantially the same as that of FIGS. 1 to 6, except for a protrusion portion of the second data substrate body. Thus, like reference numerals may refer to like elements, and repetitive descriptions thereof may be omitted.

Referring to FIGS. 1, 2, 7 to 9, a display apparatus includes a display panel 100 and display panel driver.

The display panel 100 includes an active region AA on which an image is displayed and the peripheral region PA adjacent to the active region AA and not displaying the image. The active region AA may be referred to as a display region.

The display panel 100 may include a first substrate 110 and a second substrate 150 opposite to the first substrate 110.

The display panel driver may apply a driving signal to the display panel 100. In addition, the display panel driver may include a gate driver 300 and a data driver 400.

In an exemplary embodiment of the present invention, the display panel driver may further include a controller including a printed circuit board 200. The controller may apply a control signal to the gate driver 300 and the data driver 400.

For example, the printed circuit board 200 may include a driving circuit such as a timing controller, a power voltage generator, etc.

The data driver 400 may include a data flexible substrate 422 and a data driving chip 410 mounted on the data flexible substrate 422. The data flexible substrate 422 may electrically connect the printed circuit board 200 with the display panel 100. The data driving chip 410 may generate the driving signal.

In an exemplary embodiment of the present invention, a plurality of data flexible substrates 422 may be provided. In addition, a plurality of data driving chips 410 may be provided, each of which being mounted on a respective one of the data flexible substrates 422 as a COF.

The data flexible substrate 422 may include a first data flexible substrate 430 and a second data flexible substrate 440. The first data flexible substrate 430 may be electrically connected to the display panel 100, on which the driving chip 410 is mounted. The second data flexible substrate 440 may be disposed on a surface of the first data flexible substrate 430. The second data flexible substrate 440 may be electrically connected to the first data flexible substrate 430.

In an exemplary embodiment of the present invention, the first data flexible substrate 430 may include a first data substrate body 432 and a first data substrate connection portion 434. The first data substrate body 432, on which the data driving chip 410 is mounted, may extend in a first direction D1 crossing the second and third directions D2 and D3. The first data substrate connection portion 434 may extend from the first data substrate body 432 in the second direction D2. The first data substrate connection portion 434 may be connected to the display panel 100.

In addition, the second data flexible substrate 440 may include a second data substrate body 442 and a second data substrate connection portion 444. The second data substrate body 442 may extend in the first direction D1, and the second data substrate body 442 may make contact with the first data substrate body 432. The second data substrate connection portion 444 may extend from the second data substrate body 442 in a direction opposite to the second direction D2. The second data substrate connection portion 444 may be connected to the display panel 100.

The data driving chip 410 may be mounted on a surface 436 of the first data substrate body 432. A surface 446 of the second data substrate body 442 may make contact with the surface 436 of the first data substrate body 432.

In an exemplary embodiment of the present invention, the second data substrate body 442 may further include at least two protrusion portions 450 and 452. The at least two protrusion portions 450 and 452 may be spaced apart from each other, and the at least two protrusion portions 450 and 452 may make contact with the first data substrate body 432 of the first data flexible substrate 430.

For example, the data driving chip 410 may be disposed between the two protrusion portions 450 and 452.

An input terminal 510 of the data driving chip 410 may receive a control signal from the printed circuit board 200. The driving chip 410 may generate a driving signal based on the control signal, and the driving chip 410 may output the driving signal to a first output terminal 540 and a plurality of second output terminals 520 and 530.

In an exemplary embodiment of the present invention, the first data flexible substrate 430 may further include an input wire 514 which electrically connects the printed circuit board 200 with the input terminal 510 of the data driving chip 410. The input wire 514 may be disposed on the first data substrate body 432. A plurality of input wires 514 may be provided.

In an exemplary embodiment of the present invention, the first data flexible substrate 430 may further include a first output wire 544 which electrically connects the first output terminal 540 of the data driving chip 410 with the display panel 100. The first output wire 544 may be disposed on the surface 436 of the first data substrate body 432 and a surface 438 of the first data substrate connection portion 434.

In an exemplary embodiment of the present invention, the first data flexible substrate 430 may further include a plurality of second output wires 554 and 564. The second output wires 554 and 564 may electrically connect the second output terminals 520 and 530 spaced apart from the first output terminal 540 of the data driving chip 410 with the second data flexible substrate 440. The second output wires 554 and 564 may be disposed on the surface 436 of the first data substrate body 432.

In an exemplary embodiment of the present invention, the second data flexible substrate 440 may further include a plurality of third output wires 558 and 568. The third output wires 558 and 568 may electrically connect the second output wires 554 and 564 with the display panel 100. The third output wires 558 and 568 may be disposed on the surface 446 of the second data substrate body 442 and a surface 448 of the second data substrate connection portion 444.

The third output wires 558 and 568 may electrically connect the second output wires 554 and 564 with the display panel 100 through a plurality of middle pads 552 and 562. The middle pads 552 and 562 may be interposed between the first data substrate body 432 and the second data substrate body 442. The middle pads 552 and 562 may make contact with the second output wires 554 and 564.

The third output wires 558 and 568 may electrically connect the second output wires 554 and 564 with the display panel 100 through a plurality of second output pads 526 and 536. The second output pads 526 and 536 may be disposed on the surface 448 of the second data substrate connection portion 444. The second output pads 526 and 536 may make contact with the display panel 100.

In the display apparatus, the first data flexible substrate 430 and the second data flexible substrate 440, disposed on the first data flexible substrate 430, are connected to the peripheral region PA of the display panel 100. Accordingly, insertion of foreign matter between the first data flexible substrate 430 and the display panel 100 and between the second data flexible substrate 440 and the display panel 100 may be reduced.

In addition, the first and second data flexible substrates 430 and 440 may be simultaneously connected to the peripheral region PA of the display panel 100 with a strong adhesion. Accordingly, an electrical connection reliability between the display panel 100 and the first and second data flexible substrates 430 and 440 may be increased.

In the display panel 100 including a bottom emission structure, the first and second data flexible substrates 430 and 440 may be connected to a back surface of the first substrate 110 such that a display apparatus having a bezel-less structure is implemented.

For example, the data driving chip 410 may be arranged between the protrusion portions 450 and 452. Accordingly, mis-alignment of the data driving chip 410 may be reduced when the data driving chip 410 is connected to the data flexible substrate 422.

Figure 10:
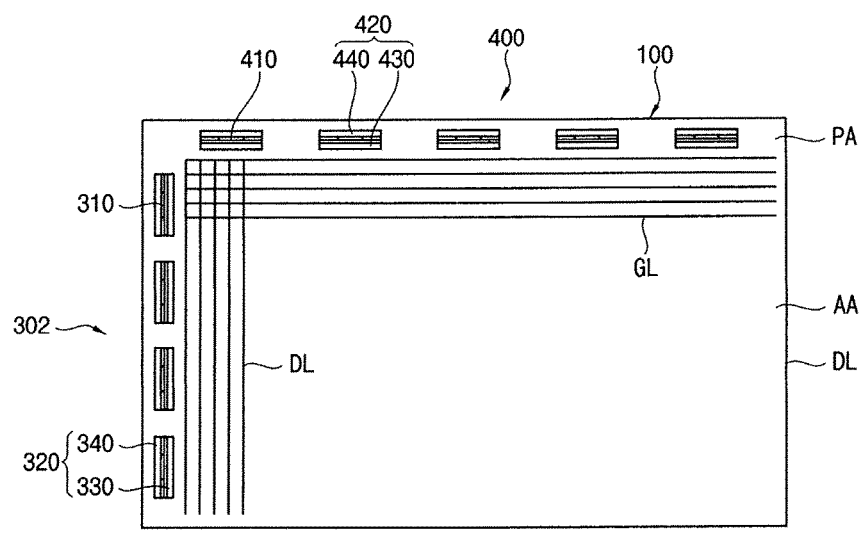
FIG. 10 is a plan view illustrating a display apparatus according to an exemplary embodiment of the present invention.
Figure 10:
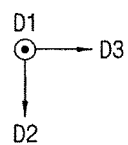
Figure 11:
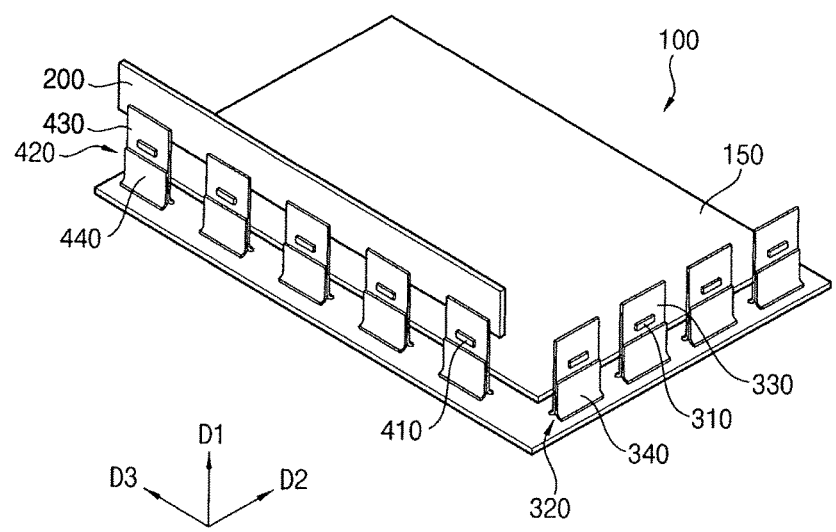
FIG. 11 is a perspective view illustrating the display apparatus of FIG. 10 according to an exemplary embodiment of the present invention.
Figure 12:
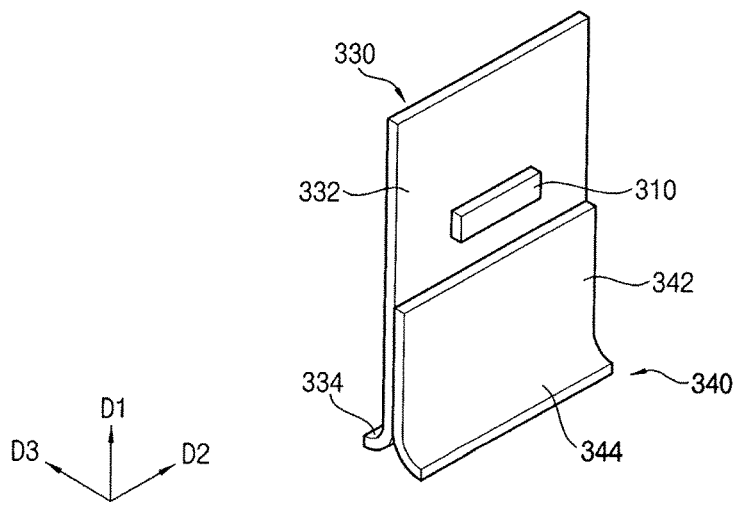
FIG. 12 is a perspective view illustrating a gate flexible substrate of FIG. 10 according to an exemplary embodiment of the present invention.
Figure 13:
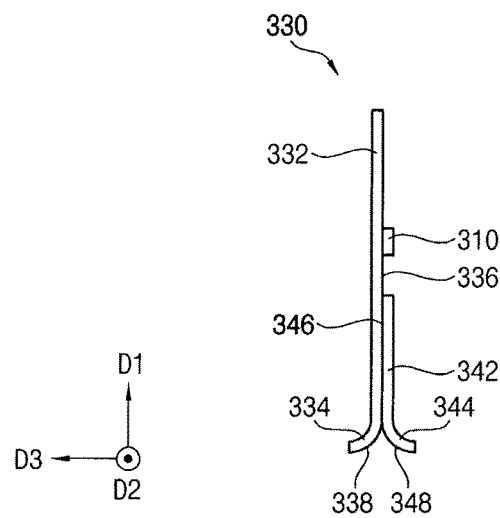
FIG. 13 is a side view illustrating the gate flexible substrate of FIG. 10 according to an exemplary embodiment of the present invention.

FIG. 10 is a plan view illustrating a display apparatus according to an exemplary embodiment of the present invention. FIG. 11 is a perspective view illustrating the display apparatus of FIG. 10 according to an exemplary embodiment of the present invention. FIG. 12 is a perspective view illustrating a gate flexible substrate of FIG. 10 according to an exemplary embodiment of the present invention. FIG. 13 is a side view illustrating the gate flexible substrate of FIG. 10 according to an exemplary embodiment of the present invention. A display apparatus of FIGS. 10 to 13 may be substantially the same as that of FIGS. 1 to 6, except for a gate driver. Thus, like reference numerals may refer to like elements, and repetitive descriptions thereof may be omitted.

Referring to FIGS. 10 to 13, a display apparatus includes a display panel 100 and display panel driver.

The display panel 100 includes an active region AA on which an image is displayed and the peripheral region PA adjacent to the active region AA and not displaying the image. The active region AA may be referred to as a display region.

The display panel 100 may include a first substrate 110 and a second substrate 150 opposite to the first substrate 110.

The display panel driver may apply a driving signal to the display panel 100. In addition, the display panel driver may include a gate driver 302 and a data driver 400.

In an exemplary embodiment of the present invention, the display panel driver may further include a controller including a printed circuit board 200. The controller may apply a control signal to the gate driver 302 and the data driver 400.

For example, the printed circuit board 200 may include a driving circuit such as a timing controller, a power voltage generator, etc.

In an exemplary embodiment of the present invention, the gate driver 302 may include a gate flexible substrate body 320 and a gate driving chip 310 mounted on the gate flexible substrate body 320. The gate driving chip 310 may generate a driving signal.

In an exemplary embodiment of the present invention, a plurality of gate flexible substrates 320 may be provided. In addition, a plurality of gate driving chips 310 may be provided, each of which being mounted on a respective one of the gate flexible substrates 320 as a COF.

The data driver 400 may include a data flexible substrate 420 and a data driving chip 410 mounted on the data flexible substrate 420. The data flexible substrate 420 may electrically connect the printed circuit board 200 with the display panel 100. The data driving chip 410 may generate the driving signal.

In an exemplary embodiment of the present invention, a plurality of data flexible substrates 420 may be provided. In addition, a plurality of data driving chips 410 may be provided, each of which being mounted on a respective one of the data flexible substrates 420 as a COF.

The gate flexible substrate 320 may include a first gate flexible substrate 330 and a second gate flexible substrate 340. The first gate flexible substrate 330 may be electrically connected to the display panel 100, on which the gate driving chip 310 is mounted. The second gate flexible substrate 340 may be disposed on a surface of the first gate flexible substrate 330. The second gate flexible substrate 340 may be electrically connected to the first gate flexible substrate 330.

In an exemplary embodiment of the present invention, the first gate flexible substrate 330 may include a first gate substrate body 332 and a first gate substrate connection portion 334. The first gate substrate body 332, on which the gate driving chip 310 is mounted, may extend in a first direction D1 crossing second and third directions D2 and D3. The first gate substrate connection portion 334 may extend from the first gate substrate body 332 in the third direction D3. The first gate substrate connection portion 334 may be connected to the display panel 100.

In addition, the second gate flexible substrate 340 may include a second gate substrate body 342 and a second gate substrate connection portion 344. The second gate substrate body 342 may extend in the first direction D1, and the second gate substrate body 342 may make contact with the first gate substrate body 332. The second gate substrate connection portion 344 may extend from the second gate substrate body 342 in a direction opposite to the third direction D3. The second gate substrate connection portion 344 may be connected to the display panel 100.

The gate driving chip 310 may be mounted on a surface 336 of the first gate substrate body 332. A surface 346 of the second gate substrate body 342 may make contact with the surface 336 of the first gate substrate body 332.

In the display apparatus, the first gate flexible substrate 330 and the second gate flexible substrate 340, separated and elongated from the first gate flexible substrate 330, are connected to the peripheral region PA of the display panel 100. Accordingly, insertion of foreign matter between the first gate flexible substrate 330 and the display panel 100 and between the second gate flexible substrate 340 and the display panel 100 may be reduced.

In addition, the first and second gate flexible substrates 330 and 340 may be simultaneously connected to the peripheral region PA of the display panel 100 with a strong adhesion. Accordingly, an electrical connection reliability between the display panel 100 and the first and second gate flexible substrates 330 and 340 may be increased.

Figure 14:
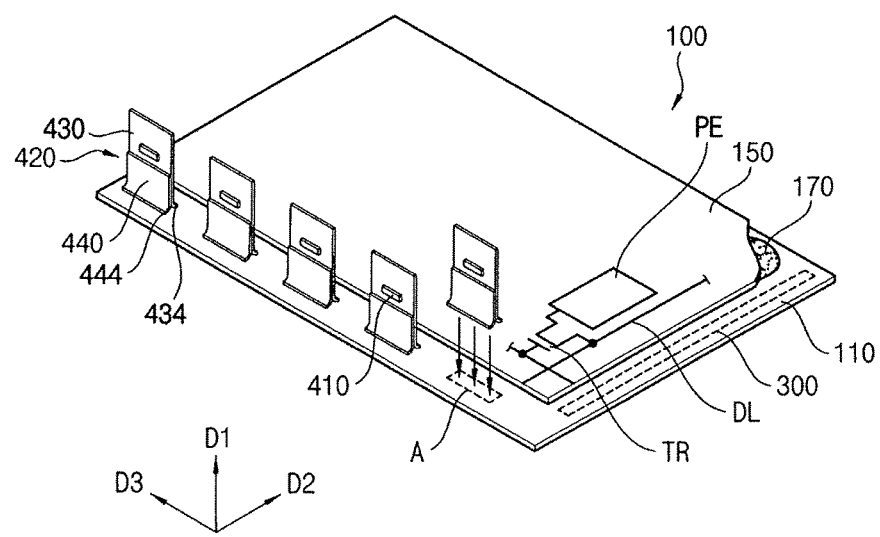
FIGS. 14 to 16 are perspective views and an enlarged view illustrating a method of manufacturing a display apparatus according to an exemplary embodiment of the present invention.
Figure 15:
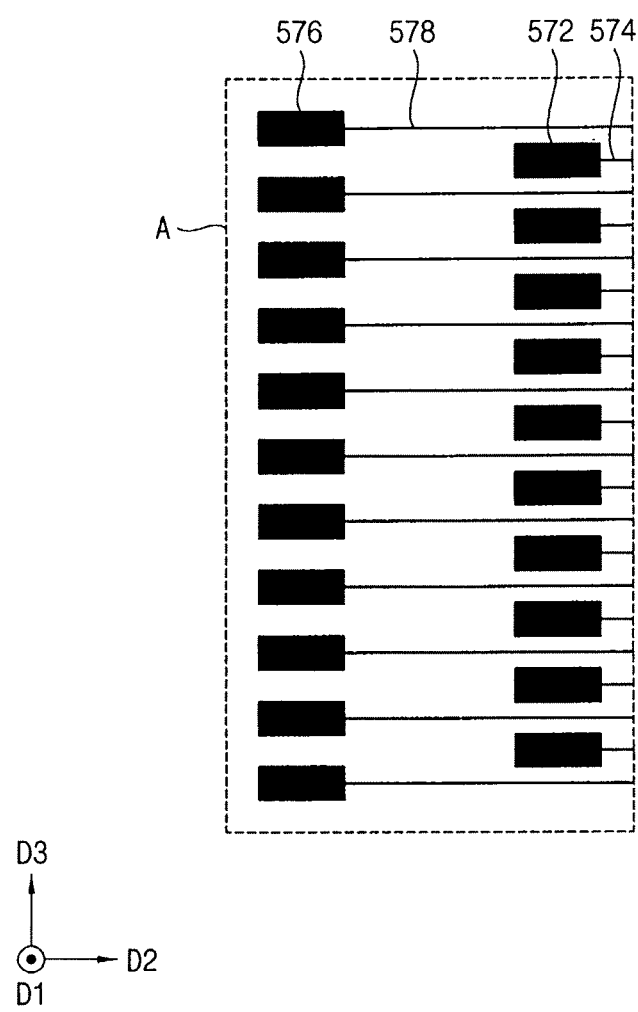
Figure 16:
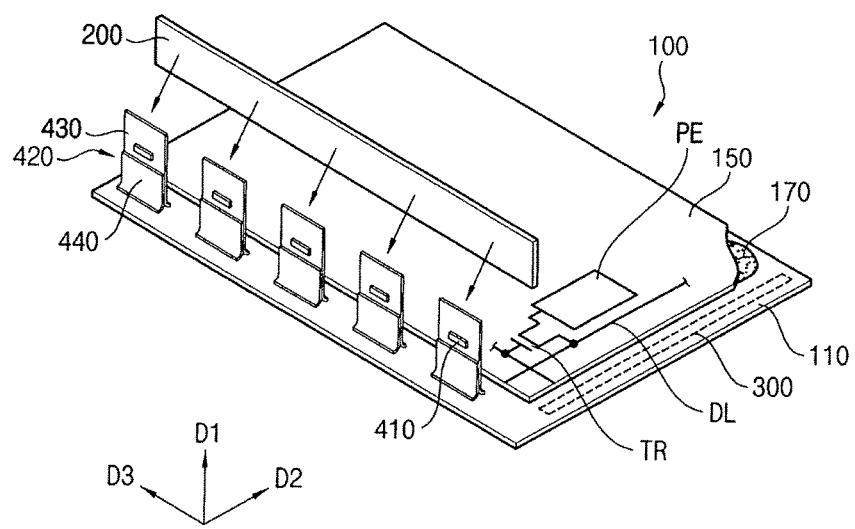

FIGS. 14 to 16 are perspective views and an enlarged view illustrating a method of manufacturing a display apparatus according to an exemplary embodiment of the present invention. For example, FIGS. 14 and 16 are perspective views illustrating a method of manufacturing a display apparatus according to an exemplary embodiment of the present invention. FIG. 15 is an enlarged view of a region "A" of FIG. 14, according to an exemplary embodiment of the present invention.

Referring to FIGS. 14 and 15, a display panel 100 including a first substrate 110 and a second substrate 150 facing the first substrate 110 is provided. The first substrate 110 may include a switching element TR and a pixel electrode PE electrically connected to the switching element TR.

A data flexible substrate 420 may be connected to the display panel 100. The data flexible substrate 420 may include first and second data flexible substrates 430 and 440.

The first and second data flexible substrates 430 and 440 may be connected to a peripheral region of the display panel 100. A data driving chip 410 may be mounted on the first data flexible substrate 430. The first data flexible substrate 430 may be electrically connected to the display panel 100. The second data flexible substrate 440 may be disposed on a surface of the first data flexible substrate 430. The second data flexible substrate 440 may be electrically connected to the display panel 100 and the first data flexible substrate 430.

For example, the data flexible substrate 420 may include a shape memory material. Heat is applied to the first and second data flexible substrates 430 and 440 such that first and second data substrate bodies 432 and 442 and first and second data substrate connection portions 434 and 444 connect to the peripheral region PA of the display panel 100.

When heat is applied to the first and second data flexible substrates 430 and 440, the first data substrate connection portion 434 may be bent to extend along the second direction D2, and the second data substrate connection portion 444 may be bent to extend in a direction opposite to the second direction D2.

The first data flexible substrate 430 may include the first data substrate body 432 and the first data substrate connection portion 434. The first data substrate body 432 may extend in a first direction D1. A data driving chip 410 may be mounted on the first data substrate body 432. The first data substrate connection portion 434 may extend in a second direction D2 crossing the first direction D1.

In addition, the second data flexible substrate 440 may include the second data substrate body 442 and the second data substrate connection portion 444. The second data substrate body 442 may extend in the first direction D1. The second data substrate body 442 may make contact with the first data substrate body 432. The second data substrate connection portion 444 may extend in a direction opposite to the second direction D2.

For example, the data flexible substrate 420 may be connected to the peripheral region PA of the display panel 100 such that the first and second data substrate bodies 432 and 442 are substantially perpendicular to the display panel 100.

In an exemplary embodiment of the present invention, the first and second data substrate connection portions 434 and 444 may be connected to the peripheral region PA of the display panel 100 by a thermal compression process.

As illustrated in FIGS. 6 and 15, a plurality of first panel pads 572 may be arranged along the third direction D3. The first panel pads 572 may be disposed on the peripheral region PA of the display panel 100. The first panel pads 572 may correspond to a plurality of first output pads 542 disposed on a surface 438 of the first data substrate connection portion 434.

The first panel pads 572 may be electrically connected to the first output pads 542. The first panel pads 572 may be also electrically connected to a plurality of data lines DL through a plurality of first panel wires 574.

In addition, a plurality of second panel pads 576 may be disposed on the peripheral region PA of the display panel 100. The second panel pads 576 may be disposed on the peripheral region PA of the display panel 100. The second panel pads 576 may correspond to a plurality of second output pads 526 and 536 disposed on a surface 448 of the second data substrate connection portion 444.

The second panel pads 576 may be electrically connected to the second output pads 526 and 536. The second panel pads 576 may be also electrically connected to the data lines DL through a plurality of second panel wires 578.

In an exemplary embodiment of the present invention, the first and second panel pads 572 and 576 may be arranged along the third direction D3 in a zigzag shape. For example, in an exemplary embodiment of the present invention, the first and second panel pads 572 and 576 are arranged to alternate in a zigzag shape along the third direction D3 crossing the first and second directions D1 and D2.

Referring to FIG. 16, the data flexible substrate 420 may be connected to a printed circuit board 200.

For example, the data flexible substrate 420 may be connected to a plurality of pads of the printed circuit board 200 by a thermal compression process.

According to the method of manufacturing the display apparatus in accordance with an exemplary embodiment of the present invention, the first data flexible substrate 430 and the second data flexible substrate 440 disposed on the first data flexible substrate 430 are connected to the peripheral region PA of the display panel 100. Accordingly, insertion of foreign matter between the first data flexible substrate 430 and the display panel 100 and between the second data flexible substrate 440 and the display panel 100 may be reduced.

In addition, the first and second data flexible substrates 430 and 440 may be simultaneously connected to the peripheral region PA of the display panel 100 with a strong adhesion. Accordingly, an electrical connection reliability between the display panel 100 and the first and second data flexible substrates 430 and 440 may be increased.

According to an exemplary embodiment of the present invention, in a display panel 100 including a bottom emission structure, first and second flexible substrates may be connected to a back surface of an array substrate such that a display apparatus having a bezel-less structure is implemented.

While the present invention has been particularly shown and described with reference to exemplary embodiments thereof, it will be apparent to those of ordinary skill in the art that various changes in form and detail may be made therein without departing from the spirit and scope of the present invention as defined by the following claims.

What is claimed is:

1. A display apparatus comprising:
a display panel including a first substrate and a second substrate facing the first substrate, the first substrate including a switching element and a pixel electrode disposed thereon, the pixel electrode being electrically connected to the switching element; and
a display panel driver configured to apply a driving signal to the display panel, the display panel driver including:
a first flexible substrate on which a driving chip is mounted, wherein the first flexible substrate is electrically connected to the display panel; and
a second flexible substrate electrically connected to the first flexible substrate, wherein the second flexible substrate is disposed on a surface of the first flexible substrate.

2. The display apparatus of claim 1, wherein the first flexible substrate includes:
a first substrate body on which the driving chip is mounted, the first substrate body extending in a first direction; and
a first substrate connection portion extending from the first substrate body in a second direction crossing the first direction, wherein the first substrate connection portion is connected to the display panel, and
wherein the second flexible substrate includes:
a second substrate body contacting the first flexible substrate, the second substrate body extending in the first direction; and
a second substrate connection portion extending from the second substrate body in a direction opposite to the second direction, wherein the second substrate connection portion is connected to the display panel.

3. The display apparatus of claim 2, wherein the driving chip is mounted on a first surface of the first substrate body, and
wherein the second substrate body contacts the first surface of the first substrate body.

4. The display apparatus of claim 3, wherein the display panel further includes a controller configured to generate a control signal, wherein the controller is connected to the first flexible substrate, wherein an input terminal of the driving chip receives the control signal, and the driving chip generates the driving signal based on the control signal, wherein the driving signal is output through a first and a second output terminal of the driving chip, and wherein the first flexible substrate electrically connects the controller with the display panel.

5. The display apparatus of claim 4, wherein the first flexible substrate further includes:

an input wire disposed on the first substrate body, the input wire electrically connecting the controller with the input terminal of the driving chip;

a first output wire disposed on the first surface of the first substrate body and a surface of the first substrate connection portion, the first output wire electrically connecting the first output terminal with the display panel; and a second output wire disposed on the surface of the first substrate body, the second output wire electrically connecting the second flexible substrate with the second output terminal.

6. The display apparatus of claim 5, wherein the input wire electrically connects the controller with the input terminal of the driving chip through an input pad, and wherein the input pad is disposed on the first surface of the first substrate body, and the input pad contacts the controller.

7. The display apparatus of claim 5, wherein the first output wire electrically connects the first output terminal of the driving chip with the display panel through a first output pad, and wherein the first output pad contacts the display panel, and the first output pad is disposed on the surface of the first substrate connection portion.

8. The display apparatus of claim 5, wherein the second flexible substrate further includes:

a third output wire disposed on a surface of the second substrate body and a surface of the second substrate connection portion, the third output wire electrically connecting the second output wire with the display panel.

9. The display apparatus of claim 8, wherein the third output wire electrically connects the second output wire with the display panel though a middle pad, and wherein the middle pad is interposed between the first substrate body and the second substrate body, and the middle pad contacts the second output wire.

10. The display apparatus of claim 8, wherein the third output wire electrically connects the second output wire with the display panel though a second output pad, and wherein the second output pad is disposed on the surface of the second substrate connection portion, and the second output pad contacts the display panel.

11. The display apparatus of claim 10, wherein the first output wire electrically connects the first output terminal of the driving chip with the display panel through a first output pad, wherein the first output pad contacts the display panel, and the first output pad is disposed on the surface of the first substrate connection portion, and wherein, when a plurality of first output pads are disposed on the first surface of the first substrate connection portion and a plurality of second output pads are disposed on the surface of the second substrate connection portion, the plurality of first output pads and the plurality of plurality of second output pads are arranged to alternate in a zigzag shape along a third direction crossing the first and second directions.

12. The display apparatus of claim 2, wherein the second substrate body further includes:

at least two protrusion portions protruding in the first direction, wherein the at least two protrusion portions are spaced apart from each other and contact the first substrate body of the first flexible substrate.

13. The display apparatus of claim 12, wherein the driving chip is disposed between the at least two protrusion portions.

14. The display apparatus of claim 1, wherein the driving signal includes a data voltage, and the driving chip is a data driving chip configured to generate the data voltage.

15. The display apparatus of claim 1, wherein the driving signal includes a gate signal, and the driving chip is a gate driving chip configured to generate the gate signal.

16. The display apparatus of claim 1, wherein the display panel has a bottom emission structure.

17. The display apparatus of claim 1, wherein the display panel further includes a liquid crystal layer or an organic light emitting layer, interposed between the first and second substrates.

* * * * *